March 25, 1958 D. McALLEY 2,828,430

TUNING DRIVE DEVICE

Filed Jan. 27, 1955 4 Sheets-Sheet 1

INVENTOR.
DAVID McALLEY

BY [signature]

AGENT.

March 25, 1958 D. McALLEY 2,828,430

TUNING DRIVE DEVICE

Filed Jan. 27, 1955 4 Sheets-Sheet 2

INVENTOR.
DAVID McALLEY
BY [signature]
AGENT.

March 25, 1958 D. McALLEY 2,828,430

TUNING DRIVE DEVICE

Filed Jan. 27, 1955 4 Sheets-Sheet 3

INVENTOR.
DAVID McALLEY
BY
AGENT.

INVENTOR.
DAVID McALLEY
BY
AGENT.

2,828,430

TUNING DRIVE DEVICE

David McAlley, New Rochelle, N. Y., assignor to North American Philips Company, Inc.

Application January 27, 1955, Serial No. 484,389

3 Claims. (Cl. 310—91)

This invention relates to electrically controlled tuning drive devices, and particularly to such devices for use in systems for remotely tuning radio receivers and the like. The invention is particularly applicable for the remote tuning of a radio compass receiver in an aircraft and will be described in connection with this use. However, it should be well understood that the invention is equally applicable to other forms of radio equipment which is to be controlled from a remote location.

There is a trend toward the use of increased amounts of electronic equipment in airplanes, ships, and other vehicles. This electronic equipment is used primarily for communication, radar, loran, and control purposes. So much of this and other equipment is used, that not all of it can be placed conveniently near the operating position. Therefore, it is becoming increasingly necessary to locate some of the electronic equipment remotely from the operating position and to tune or adjust it by means of remote control tuning drive devices. It is important that the tuning drive devices be compact and light in weight.

The principal objects of the invention are to provide a sensitive and reliable tuning drive device which is more compact and lighter in weight than such devices have been heretofore. Another object is to provide a tuning drive device in which the parts thereof are readily accessible for servicing. Still other objects will be apparent hereinafter.

The objects of the invention are achieved by means of novel structural arrangements of the component parts. In accordance with the preferred embodiment of the invention, the tuning drive device comprises an L-shaped back plate, with a drive motor and balancing potentiometer supported by one leg of the back plate, and with a novel electrical circuit chassis arrangement supported by the other leg of the back plate. The invention provides a tuning drive device which is less than half the weight, and occupies less than one-third the volume, than prior art remote tuning devices.

Figure 1:
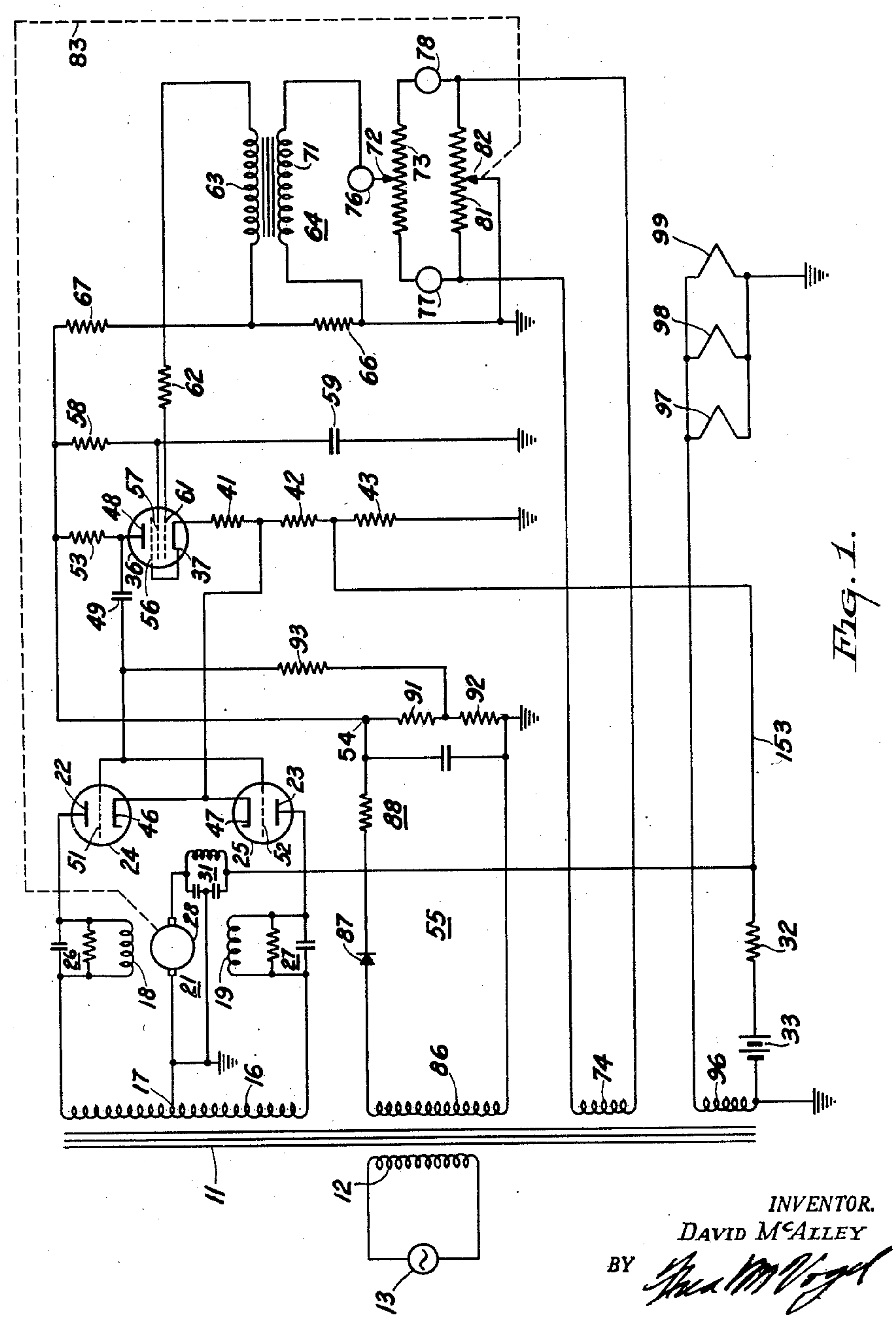
Fig. 1 is an electrical schematic diagram of the preferred embodiment of the invention.

Referring to Fig. 1, the electrical circuit of the remote tuning device comprises a power transformer 11 having a primary winding 12 connected across a power source 13 of A.-C. voltage. A secondary winding 16 has a center tap 17 connected to electrical ground, and the ends of this winding are respectively connected through field windings 18, 19 of a drive motor 21 to anodes 22, 23 of electron control tubes 24, 25. Resistance-capacitance filters 26, 27 are connected respectively across the field windings 18, 19. An armature 28 of the drive motor 21 is connected in a closed series circuit comprising a filter 31, a voltage-dropping resistor 32, and a source 33 of D.-C. voltage, this circuit being connected to electrical ground at the junction of the armature 28 and the voltage source 33.

An amplifier tube 36 contains a cathode 37 connected to electrical ground through series-connected resistors 41, 42, and 43, the junction of resistors 41 and 42 being connected to cathodes 46, 47 respectively of the control tubes 24, 25, and the junction of resistors 42 and 43 being connected to the junction of the filter 31 and resistor 32. The amplifier tube 36 also contains an anode 48 connected through a condenser 49 to control grids 51, 52 of the tubes 24, 25 respectively and connected through a load resistor 53 to a terminal 54 of a source 55 of operating voltage, a suppressor grid 56 connected to the cathode 37, a screen grid 57 connected to the terminal 54 through a resistor 58 and bypassed to electrical ground through a condenser 59, and a control grid 61 connected through a resistor 62 to an end of a secondary winding 63 of a coupling transformer 64, the remaining end of the winding 63 being connected through a resistor 66 to electrical ground and through a resistor 67 to the terminal 54.

A primary winding 71 of the coupling transformer 64 is connected at one end thereof to electrical ground and is connected at the other end thereof to an adjustable tap 72 of a tuning control potentiometer 73, the ends of this potentiometer being connected across a source of A.-C. voltage comprising a secondary winding 74 of the transformer 11. The potentiometer 73 is located remotely from the rest of the circuit of Fig. 1, and is associated therewith by means of wires connected to the terminals 76, 77, and 78. A balancing potentiometer 81 is connected electrically across the tuning control potentiometer 73 and has an adjustable tap 82 connected to electrical ground and mechanically coupled to the armature 28, as indicated by the dashed line 83, so as to be driven thereby.

The voltage source 55 comprises a secondary winding 86 on the transformer 11, one end of which is electrically grounded and the other end of which is connected through a rectifier 87 and filter 88 to the voltage terminal 54. Voltage divider resistors 91, 92 are connected in series between the terminal 54 and electrical ground, and a resistor 93 is connected between the junction of the resistors 91, 92 and the control grids 51, 52 of the control tubes 24, 25. A secondary winding 96 on the transformer 11 is connected to supply power to the heaters 97, 98, 99 of the tubes 24, 25 and 36 respectively.

Figure 2:
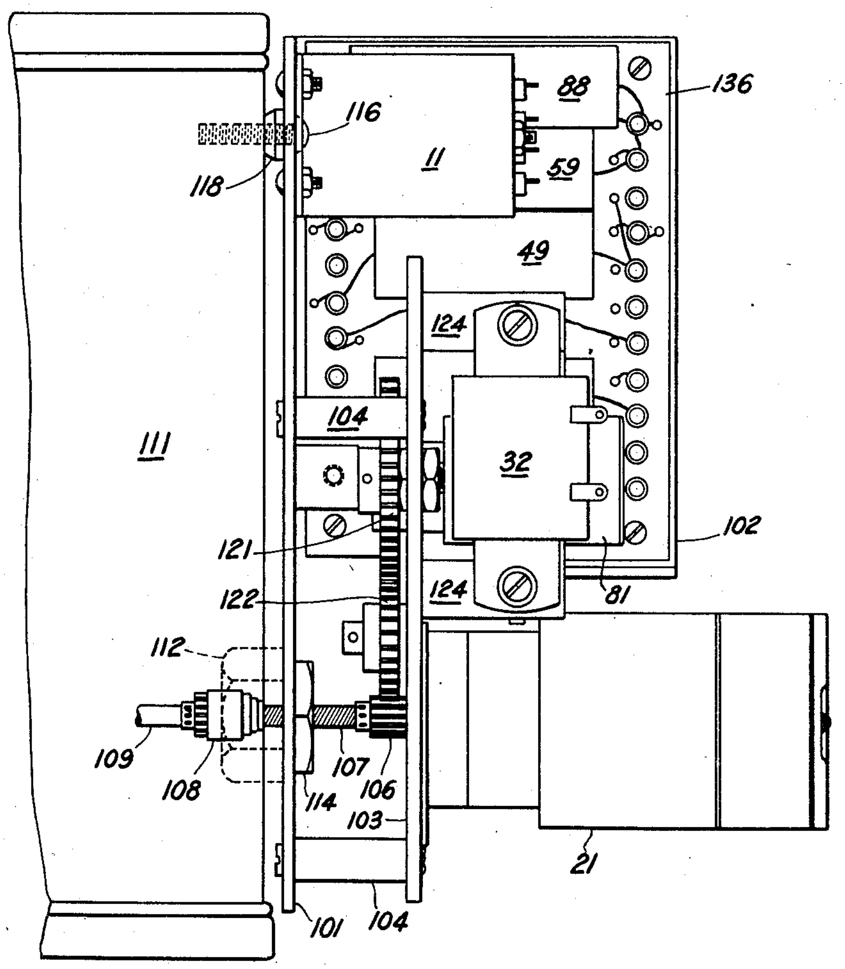
Fig. 2 is a side view of the structure of a preferred embodiment of the invention, shown in combination with a radio receiver to be tuned thereby.
Figure 3:
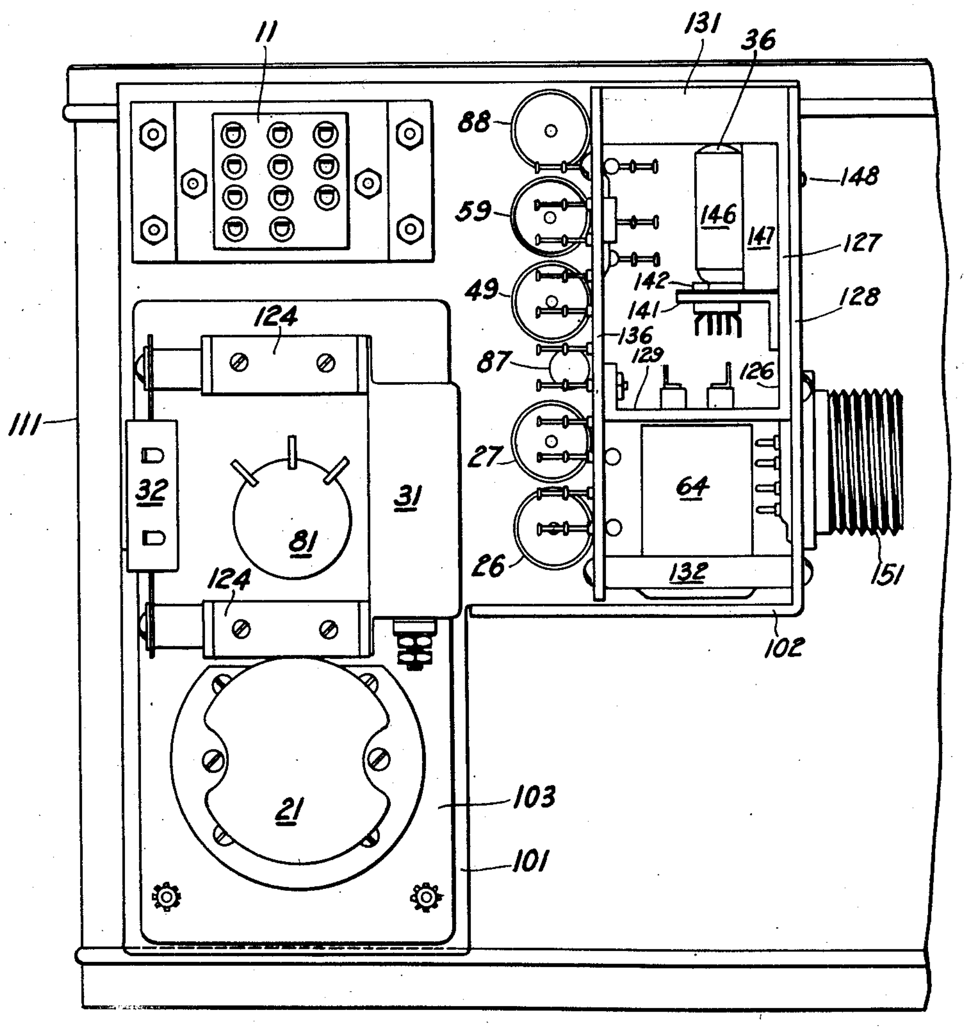
Fig. 3 is a front view of the embodiment of Fig. 2.
Figure 4:
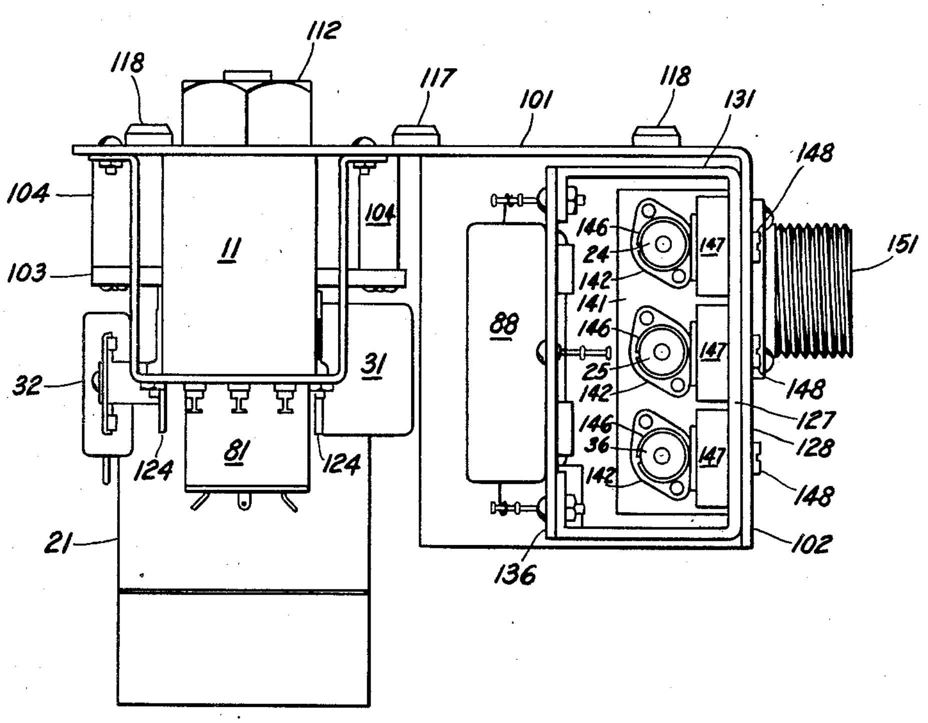
Fig. 4 is a top view of the tuning device shown in Fig. 2.

Referring now to Figs. 2, 3 and 4, the tuning drive device comprises an L-shaped back plate 101 having an L-shaped extension member 102 extending forwardly from an end and inner side of a leg thereof, as shown. A base plate 103 is attached in front of the remaining leg of the back plate 101 in parallel spaced relationship thereto by means of bushings 104. The drive motor 21 is attached at an end thereof to the lower part of the base plate 103. The drive shaft of the motor 21 extends through an opening in the base plate 103 and has a drive gear 106 attached thereto. A flexible shaft 107 extends from the drive gear 106 and extends through an opening in the back plate 101, and has a splined coupler 108 attached to the end thereof which engages a splined tuning shaft 109 in a radio receiver 111. An attachment nut 112 is threaded onto a coupling member (not shown) in the receiver 111, and a securing nut 114, which surrounds the flexible shaft 107, extends through the back plate 101 and is threaded into the attachment nut 112, thus securing the back plate 101 to the receiver 111. The back plate 101 is further secured to the receiver 111 by means of a screw 116 which extends through the upper part of the back plate 101 and a bushing 117 and is threaded into the receiver 111. Spacers 118 attached to the back plate 101 aid in aligning the back plate 101 with respect to the receiver 111.

The driven balancing potentiometer 81 is attached to the base plate 103 above the drive motor 21 and has a shaft, which is coupled to the adjustable tap 82 (see Fig. 1) and which extends through the base plate 103 and terminates at a gear 121. An idler gear 122 engages the gears 106 and 121, whereby the tap 82 of the potentiometer 81 is adjusted in accordance with the rotation of the tuning shaft 109 by the drive motor 21. The filter 31 and the voltage-dropping resistor 32 are positioned respectively near the sides of the potentiometer 81 by means of brackets 124. The power transformer 11 is attached to the back plate 101 at the elbow thereof and above the base plate 103.

An L-shaped chassis 126 has a back portion 127 attached to and against the outer leg 128 of the L-shaped extension 102 and a base portion 129 extending inwardly from the outer leg 128 and positioned perpendicular with respect to the back plate 101. A pair of brackets 131 extend inwardly from the sides of the back portion 127 of the chassis 126, and a pair of brackets 132 extend inwardly from the outer leg 128 near the elbow of the L-shaped extension 102. A terminal board 136 is attached to the ends of the brackets 131 and brackets 132, and to the edge of the base portion 129 of the chassis 126. All of the condensers, the rectifier 87 and all of the resistors except the voltage-dropping resistors 32, and series grid resistor 62, are mounted on the terminal board 136. The coupling transformer 64 is fastened to the underside of the base portion 129 of the chassis 126.

A horizontal sub-chassis 141 is attached to the back portion 127 of the chassis 126, and extends inwardly therefrom and is perpendicular to the back plate 101. The three tube sockets 142 are attached to the sub-chassis 141 in a row parallel to the back portion 127. The tubes 24, 25, 36 are plugged into these sockets, as shown. Metal heat dissipation shields 146 respectively surround the tubes in a tight-fitting manner and are respectively attached to metal heat dissipation blocks 147 which are respectively attached snugly against the back portion 127 of the chassis 126 by means of screws 148 which pass through the outer leg 128 and the back portion 127 and are threaded into the heat dissipation blocks 147. The heat dissipation shields 146 and blocks 147 serve effectively to conduct heat away from the tubes 24, 25 and 36. The back portion 127 of the chassis 126 serves as a support plate for the sub-chassis and as a heat-dissipation plate to aid in dissipating heat from the electronic tubes. Any of the tubes is easily removed, when desired, by removing the proper screw 148 and lifting the block 147, along with the shield 146 and associated tube, upwardly and out of the assembly.

A multiple-contact receptacle 151 is attached to the outside of the outer leg 128 of the L-shaped extension 102, to which a control cable (not shown) may be attached for electrically connecting the sources of power 13, 33 and the remote tuning control potentiometer 73 to the tuning device. Suitable electrical wiring (not shown) is connected among the various components in accordance with the schematic diagram of Fig. 4. An L-shaped protective cover (not shown) is normally positioned over the device.

The tuning drive device operates as follows: The voltage source 33 supplies D.-C. current through the armature 28 of the drive motor 21 via the resistor 32, the amount of this current depending mainly on the amount of field excitation produced by the field windings 18, 19 and on the load presented by the receiver tuning shaft 109, the gears 106, 122, 121, and the driven potentiometer 81. In the preferred embodiment of the invention, the armature current is 0.8 ampere when the motor is not running. The control tubes 24, 25 which may be of the type 5718, are biased so that each tube alternately passes an average current of 3.0 milliamperes with a supply voltage of 250 volts (400 cycle A. C.) from the secondary winding 16. These currents flow respectively through the field windings 18, 19, and are in the form of half-cycle waves 180 degrees out-of-phase. These normal field currents of 3.0 ma. would tend to cause the armature 28 to rotate in alternately opposite directions but, due to inertia, the motor cannot respond to the 400 cycle reversal of current, and therefore the armature remains stationary.

Conductivity of the control tubes 24, 25 is controlled by the A.-C. sine wave signal developed in the secondary winding 63 of the transformer 64, this signal being amplified by the tube 36 and fed to the grids 51, 52 of the control tubes 24, 25. If this A.-C. grid signal is in phase with the plate voltage of tube 24, then this tube will conduct and tube 25 will not conduct, and the armature 28 will rotate in one direction; conversely, if the A.-C. grid signal is in phase with the plate voltage of tube 25, then this tube will conduct and tube 24 will not conduct, and the armature 28 will rotate in the opposite direction. The potentiometers 73, 81 form a bridge circuit 152, with the input signal being supplied by the power transformer winding 74 and the output signal being fed to the primary winding 71 of transformer 64. When the bridge 152 is balanced, i. e., when the motor-driven potentiometer tap 82 is positioned corresponding to the position of the remote-control potentiometer tap 72, there is zero output voltage from the bridge, and the control tubes 24, 25 are alternately conductive in equal amounts, and the drive motor 21, and hence the tuning of the receiver 111, remains stationary.

If the remotely positioned potentiometer tap 72 is moved corresponding to a desired setting of the tuning shaft 109 in the receiver 111, the bridge 152 becomes unbalanced and an A.-C. voltage is fed to the transformer 64 in proper phase to cause one of the control tubes 24, 25 to become conductive and the other non-conductive and thus cause the armature 28 to rotate in the proper direction so that, as the receiver 111 is tuned to the desired setting, the driven potentiometer tap 82 is moved toward a point which will cause the bridge 152 to become balanced. When, due to action of the drive motor 21, the correct tuning of the receiver 111 is reached, the bridge 152 is balanced by the concurrent movement of the arm 82 which has taken place by means of the gears 106, 121 and 122 thereby causing the control voltage at the transformer 64 to become zero, and the drive motor 21 stops. At maximum unbalance, one of the control tubes 24, 25 draws 4 ma. and the other tube has zero plate current.

Stability and operation of the circuit is improved by the connection 153 of the junction of the voltage-dropping resistor 32 and the filter 31, to the junction of the resistors 42 and 43. This connection causes the amplifier tube 36 and control tubes 24 and 25 to be the most sensitive when the system is in balance, i. e., when the receiver 111 is properly tuned, and relatively less sensitive while the drive motor 21 is operating. The change in sensitivity is caused by a change in cathode bias of the amplifier tube 36 and control tubes 24 and 25 in accordance with change in current in the armature 28. When the motor 21 is not running, the armature current is maximum and the voltage drop across resistor 32 is maximum, thus biasing the amplifier tube 36, via connection 153, for greater gain. When the motor 21 operates, the armature current decreases, the voltage drop across resistor 32 decreases, and the gain of the amplifier tube 36 and control tubes 24 and 25 is reduced. This aids in obtaining quick tuning response, and a constant motor speed over the tuning range of the receiver.

From the foregoing, it is apparent that the invention has provided an improved arrangement of electrical components which results in a more compact and more effective tuning drive device than has hitherto been obtainable.

The novel positioning of electronic tubes, with the associated heat shields, in the space between a heat-dissipating plate and a terminal board, insures a compact arrangement along with adequate cooling of the tubes and prevention of overheating of the terminal board. The invention further provides for convenient removal of individual tubes whereby a tube may be removed by manually gripping the appropriate heat-dissipation block, thus avoiding direct contact by the fingers with the tube.

While a preferred embodiment of the invention has been shown and described, various other embodiments and modifications thereof will be apparent to those skilled in the art, and will fall within the scope of invention as defined in the following claims.

What is claimed is:

1. A tuning drive device comprising an L-shaped back plate, an L-shaped extension member extending forwardly from an end and inner side of a leg of said back plate, a base plate positioned in front of the remaining leg of said back plate and parallel thereto, a drive motor attached at an end thereof to said base plate in the vicinity of the end of said remaining leg and extending at a right angle from said base plate and having a shaft extending through openings in said base plate and back plate, a driven potentiometer attached at an end thereof to said base plate and extending at a right angle from said base plate and having an adjusting shaft extending through an opening in said base plate, means coupling said potentiometer shaft to said motor shaft so as to be driven thereby, a power transformer attached to said back plate at the elbow thereof, an L-shaped chassis having a back portion attached against the outer leg of said L-shaped extension and a base portion extending inwardly from said outer leg and positioned perpendicular with respect to said back plate, a pair of brackets extending inwardly from the sides of said back portion, a terminal board attached to the ends of said brackets and to the inward end of said base portion, electrical components attached to said terminal board, a sub-chassis attached to said back portion and extending inwardly therefrom and perpendicular with respect to said back plate, a plurality of tube sockets attached to said sub-chassis, a plurality of elongated electronic tubes respectively positioned in said sockets and extending therefrom parallel to one another and to said back portion, said tubes being connected in electrical circuit combination with said electrical components, a plurality of heat dissipation shields respectively tightly surrounding said tubes along substantial portions of the lengths thereof, a plurality of heat dissipation blocks respectively attached to said shields and removably attached to said back portion, each of said blocks having a length extending along and being in heat-transfer engagement with substantially the entire length of the associated shield, said blocks being arranged so that the thinnest dimension thereof extends between said back portion and the associated shield thereby to facilitate rapid heat transfer through said blocks and a coupling transformer attached to the base portion of said L-shaped chassis.

2. An electrical circuit assembly comprising a chassis having a back portion, a sub-chassis extending perpendicularly from said back portion, a tube socket attached to said sub-chassis, an elongated electronic tube positioned in said socket and extending therefrom parallel to said back portion, a heat dissipation shield tightly surrounding said tube along a substantial portion of the length thereof, and a heat dissipation block attached to said shield and removably attached to said back portion, said block having a length extending along and being in heat-transfer engagement with substantially the entire length of said shield, and said block being arranged so that the thinnest dimension thereof extends between said shield and said back portion thereby to facilitate rapid heat transfer through said block.

3. An electrical circuit assembly comprising a chassis of thermally conductive material, an elongated electronic component subject to changing temperature during operation thereof and positioned in parallel spaced relationship with respect to said chassis, a thermally conductive shield positioned to tightly surround said component along a substantial portion of the length thereof, and a thermally conductive block positioned between and attached to both said shield and said chassis, said block having a length extending along and being in thermal engagement with substantially the entire length of said shield, said block being arranged so that the thinnest dimension thereof extends between said shield and said chassis thereby to facilitate rapid thermal transfer through said block.

References Cited in the file of this patent

UNITED STATES PATENTS

| | | |
|---|---|---|
| 2,178,220 | Blancha | Oct. 31, 1939 |
| 2,326,692 | Shipley et al. | Aug. 20, 1943 |
| 2,641,635 | Scal et al. | June 9, 1953 |
| 2,668,933 | Shapiro | Feb. 9, 1954 |
| 2,745,895 | Lideen | May 15, 1956 |